United States Patent

[11] 3,587,089

[72] Inventor Noel P. Elliott
Ashland, Mass.
[21] Appl. No. 704,961
[22] Filed Nov. 2, 1967
[45] Patented June 22, 1971
[73] Assignee Raytheon Company
Lexington, Mass.

[54] ANALOG TO GRAY CODE CONVERTER
10 Claims, 9 Drawing Figs.

[52] U.S. Cl. .......... 340/347
[51] Int. Cl. .......... H03k 13/06
[50] Field of Search .......... 340/347

[56] References Cited
UNITED STATES PATENTS
3,484,779 12/1969 Kiyasu .......... 340/347
3,460,122 8/1969 Barber .......... 340/347
3,187,325 6/1965 Waldhaver .......... 340/347

*Primary Examiner*—Daryl W. Cook
*Assistant Examiner*—Jeremiah Glassman
*Attorneys*—Harold A. Murphy and Joseph D. Pannone

ABSTRACT: Apparatus for converting an analog signal to a digital number represented in Gray code, the apparatus including a chain of threshold circuits in combination with a plurality of folding circuits, each threshold circuits of the chain determining whether the analog signal is above the midpoint of its input range. If the analog signal is above the midpoint, the analog signal is fed directly to the next threshold circuit and a bit is produced and if the analog signal is below the midpoint, the analog signal is inverted and is then passed to the next threshold circuit and folding circuit.

INVENTOR
NOEL P. ELLIOTT
BY Irving S. Rappaport
ATTORNEY

INVENTOR
NOEL P. ELLIOTT

BY Irving S. Rappaport
ATTORNEY

ANALOG TO GRAY CODE CONVERTER

BACKGROUND OF THE INVENTION

This invention relates to an analog to Gray code converter which is capable of converting analog levels and the corresponding digital output in Gray code. Prior art converters of other than Gray Code types are relatively complex and require a large number of elements. Such converters usually employ voltage or current switches which tend to limit the speed of such circuits. Prior art converters also may have the limitations of requiring synchronous operation interrupting their operation whenever the output is to be used in order to avoid gross errors. Prior art converters of the Gray Code type are characterized by a requirement for one or more large expensive components. For a more complete discussion of Gray Code, reference may be made to a source such as Phister, "Logical Design of Digital Computers," Wiley & Sons, 1959, Pages 232—234 and 399—401.

The converter of the present invention may be constructed with a relatively small number of elements. This simplification is partly due to the nature of the Gray Code, which permits the use of simple limiting amplifiers in place of triggering threshold circuits without degrading the digital output signals. Since this converter does not employ voltage or current switches, it has a much higher speed than other such devices and is capable of digitizing signals at a sample rate in excess of 2.5 mHz. Also, because the output is in Gray Code, it may be sampled without error at any time, including the transition periods between quantization levels. The present invention employs a special foldover technique to obtain the conversion from analog to Gray Code.

SUMMARY OF THE INVENTION

The above advantages and features as well as others are achieved by providing an analog to Gray Code converter for converting an analog signal to a digital number represented in Gray Code, said converter comprising a plurality of folding circuits having a threshold circuit associated with each folding circuit, the threshold circuit associated with each folding circuit determining whether the analog signal is above the midpoint of its input range and feed the analog signal directly to the next threshold circuit and produce an output bit in Gray Code if the signal is above the midpoint while if it is below the midpoint, the analog signal is inverted and passed on to the next threshold circuit and folding circuit.

DESCRIPTION OF THE PREFERRED EMBODIMENT

Figure 1:
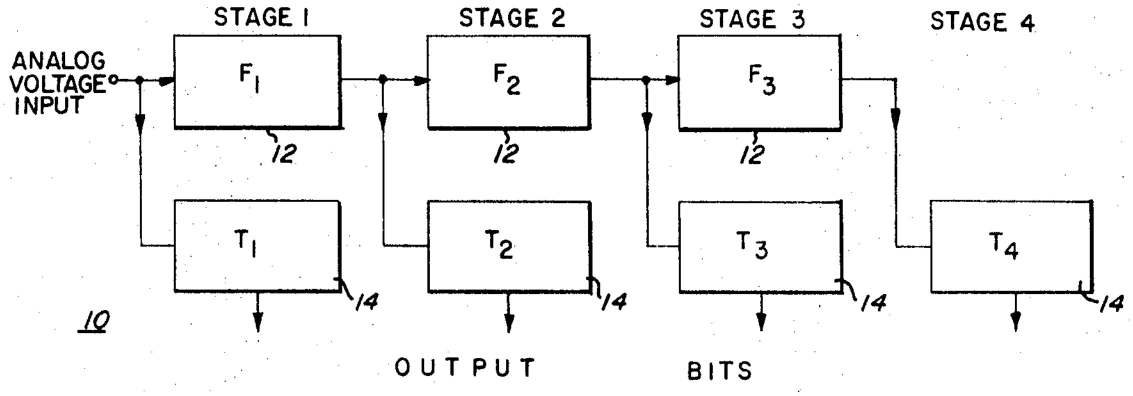
FIG. 1 is a block diagram of the converter of the present invention.

FIG. 1 shows an analog to Gray Code converter 10 consisting of four stages, each stage including a folding circuit 12 and a threshold circuit 14. The embodiment of FIG. 1 shows stages

1, 2, 3 and 4. The folding circuits 12 are connected sequentially to one another beginning at the input terminal to which the analog voltage is applied. Associated with the folding circuit 12 of each separate stage is a threshold circuit 14 which is connected across the input to each folding circuit 12. The output from the converter 10 consists of four bits of Gray Code in parallel, with one output bit from each threshold circuit 14. Although FIG 1 shows four stages, the number of output bits is completely arbitrary and any number of stages may be employed.

Figure 3:
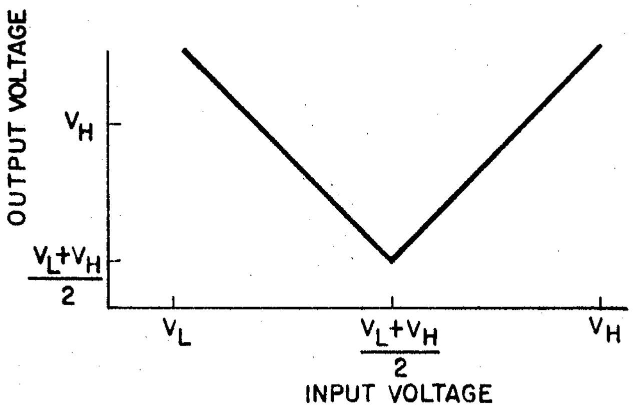
FIG. 3 is a graph of the transfer characteristic of the first folding circuit shown in FIG. 1.

Each of the folding circuits 12 functions similarly as do each of the threshold circuits. Each of the folding circuits 12 combines with its corresponding threshold circuit 14 to form a single stage of the converter. The first folding circuit operates in accordance with the transfer characteristic graph shown in FIG. 3 as follows. $V_L$ and $V_H$ represent the lower and upper limits of the input voltage range of the converter. The first threshold circuit 14 labeled $T_1$ decides whether the input voltage is above, or below the mid point $(V_L+V_H)/2$ of this range and produces a bit at its output accordingly. Meanwhile, the folding circuit 12 labeled $F_1$, operates in the following manner. If the input voltage is above the input range mid point, circuit $F_1$ passes the input directly on to the next stage and if the input is below the midpoint, circuit $F_1$ passes on to the next stage a voltage equal to $V_H+V_L$ minus the input voltage, thus folding the lower half of the input range over onto the upper half. FIG. 3 is a graph of the output of circuit $F_1$ plotted against its input.

Although the actual transfer characteristic differs slightly from that shown in FIG. 3, as a result of diode and transistor forward conduction voltage drops, the circuit does maintain the magnitudes of the slopes of the two line segments equal, and all other deviations may be compensated for by proper adjustment of the foldover and threshold point of the following stage. Thus, the first stage 1 produces a single output bit which indicates the half of the input range within which the input voltage lies, and passes on to the second stage an analog voltage representing the location of the input in that half. The folding and coding action is then repeated by stage 2. The threshold circuit 14 labeled $T_2$ decides whether the output of stage 1 is above or below the midpoint $V_L+3V_H/4$ of its range ($V_L+V_H$)/2 to $V_H$ and produces a bit accordingly. The folding circuit 12 labeled $F_2$ reflects the low half of this range onto the upper half, passing only a quarter-scale voltage range onward to the third stage.

Therefore, it can be seen that the folding circuits 12 perform their successive reflections about the one-half scale, three-fourths scale and seven-eighths scale points. The output of the second threshold circuit $T_2$ in conjunction with that of the first threshold circuit $T_1$ then indicates the quarter of the input range within which the input voltage lies. The third threshold circuit $T_3$ output narrows the input range down to the proper eighth and all four output bits together identify the input voltage to the nearest sixteenth of full scale. Because of the nature of the folding operation, the output bits appear in Gray Code instead of normal binary code.

Figure 2:
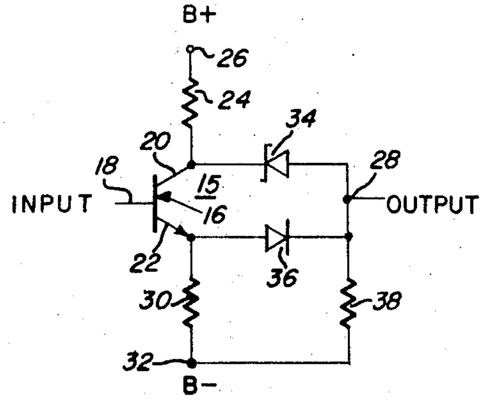
FIG. 2 is a circuit diagram of a folding circuit shown in FIG. 1.

FIG. 2 is a circuit diagram representing one embodiment of each of the folding circuits 12 shown in FIG. 1. Each folding circuit 12 consists of a unity gain phase splitter followed by a pair of diodes to select the more positive output of the phase splitter. The phase splitter 15 includes a transistor 16 having base, collector and emitter electrodes 18, 20 and 22 respectively. Also included in the phase splitter 15 is a resistor 24 connected at one end to the collector 20 and at the other end to a positive voltage source at terminal 26. A resistor 30 is connected to the emitter 22 at one end and to a terminal 32 at the other end, which terminal has a negative voltage source applied thereto. Connected between the collector 20 and an output terminal 28 is a zener diode 34, while connected between the emitter 22 and an output terminal 28 is a diode 36. A resistor 38 is connected between the terminal 32 and the output terminal 28.

The resistors 24 and 30 are chosen so that the collector voltage of the transistor 16 equals a constant minus the input voltage when the output is loaded by resistor 38 and the next folding and threshold circuits, thus giving a negative slope of unity to the transfer characteristic. The emitter electrode 22 voltage is approximately equal to the input voltage. Folding cannot take place unless the emitter and collector output ranges overlap, which is impossible directly at the transistor terminals because the transistor 16 cannot have its collector electrode 20 more negative than its emitter electrode 22. The zener diode 34 solves this problem by offsetting the collector voltage in the negative direction. The zener diode 34 voltage is chosen to be equal to the drop across the transistor 16 when the input voltage is at the desired folding point. Then when the input becomes more positive, the output is caused to follow it by the diode 36. This decreases the voltage across the zener diode 34 to a value less than its zener voltage causing it to stop conducting. If the input to the transistor 16 goes negative, the zener diode conducts in the backward direction, the output goes positive and the diode 36 is cut off.

The point in the input voltage range at which folding takes place is determined by the supply voltages and the chosen zener voltage. Consequently, it is possible to adjust the foldover point to precisely match the midpoint of the output range of the previous folding circuit. This is the only requirement which must be met when cascading several such circuits.

Figure 4:
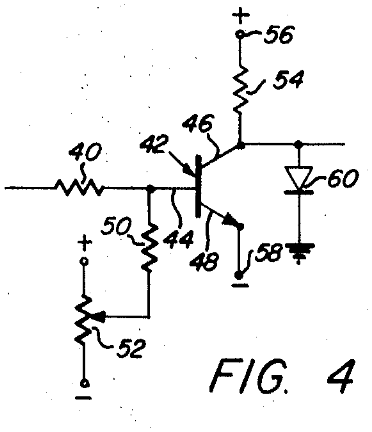
FIG. 4 is a circuit diagram of a threshold circuit shown in FIG. 1.

FIG. 4 shows a circuit diagram of a threshold circuit 14 as shown in FIG. 1. Each threshold circuit 14 has the function of deciding whether its input is above or below the foldover point of the corresponding folding circuit 12. The threshold circuit 14 includes an input resistor 40 which is connected to a transistor 42 via the transistor base electrode 44. The transistor 42 also has collector and emitter electrodes 46 and 48 respectively. One end of a resistor 50 is connected to base electrode 44 of the transistor. The other end of resistor 50 connects to a slide which is used for adjustment along a potentiometer 52. The potentiometer 52 has its terminals connected to positive and negative voltage sources respectively. The collector electrode 46 of the transistor 42 is connected to a source of positive potential at a terminal 56 via a resistor 54. The emitter electrode 48 is connected to a negative source of potential at a terminal 58. A diode 60 is connected at one end to the collector electrode 46 and at its other end to ground.

The transistor 42 of the threshold circuit 14 acts as a limiting amplifier and can be adjusted to turn on and off precisely at the foldover point of the associated folding circuit by varying the potentiometer 52 so as to set a certain level of base electrode 44 bias current through the resistor 52. The threshold circuit 14 does not require a triggering action since if the transistor 42 of each of the threshold circuits 14 has sufficient gain, three of the four threshold circuits 14 will be saturated or cut off. Errors due to misinterpretation of the remaining bit can never exceed one-half of a quantization step due to the Gray Code nature of the output.

Figure 5:
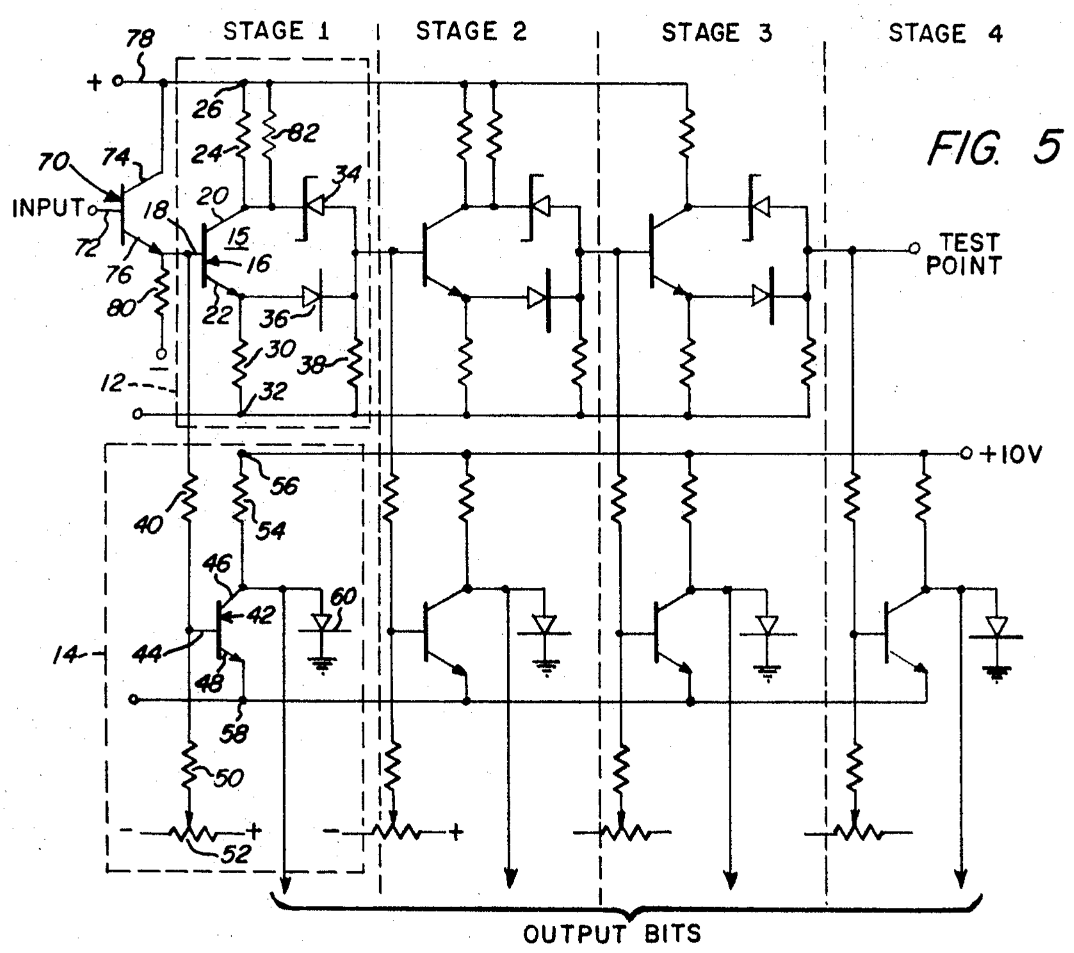
FIG. 5 is a circuit diagram of a complete embodiment of the invention as shown in FIG. 1.

FIG. 5 illustrates a complete circuit diagram of the analog to Gray Code converter shown in FIG. 1 having four stages. Each of the stages 1—4 includes a folding circuit 12 and a threshold circuit 14 as outlined in the dotted blocks of stage 1. The input analog signal is applied to the base electrode 72 of a transistor 70. The transistor 70 also has collector and emitter electrodes 74 and 76. The collector electrode 74 is connected to a line 78 to which a positive potential is applied. The line 78 is connected to each of the terminals 26 of each of the folding circuits 12. The emitter 76 has a negative potential applied thereto via a resistor 80. The emitter 76 is also connected to the inputs of both the folding and threshold circuits 12 and 14 respectively of the first stage. The resistor 82 in each of the folding circuits 12 is provided to adjust the zener diode 34 so that the folding point of each folding circuit 12 is matched to the midpoint of the output range of the previous folding circuit 12.

In operation, the threshold circuit 14 of the first stage determines whether the input voltage is above or below the midpoint $(V_L+V_H)/2$ of the input voltage range and produces a bit at the output of the threshold circuit 14. Meanwhile, the folding circuit 12 of stage 1 passes the input voltage directly on to the second stage if the input voltage is above the input range midpoint. However, if the input voltage is below the midpoint, it passes on to the second stage a voltage equal to $V_H+V_L$ minus the input voltage, thus folding the lower half of the input range over on to the upper half. Therefore, the first stage produces a single output bit which indicates the half of the input range within which the input voltage lies, and passes on to the second stage on analog voltage representing the location of the input in that half. The second stage then repeats this folding and coding action. The threshold circuit 14 of stage 2 decides whether the output from the folding circuit 12 of stage 1 is above or below the midpoint $V_L+3V_H/4$ of its range $(V_L+V_H \text{ to } V_H)/2$ and produces an output bit accordingly. The folding circuit 12 of the second stage reflects the lower half of this range on to the upper half passing only a quarter-scale voltage range onward to the third stage. It may be seen, therefore, that the folding circuits perform their successive reflections about one-half scale, three-fourths scale and seven-eighths scale points. The output of the second threshold circuit, in conjunction with that of the first, then indicates the quarter of the input range within which the input voltage lies, the third output narrows it down to the proper eighth and all 4 output bits together identify the input voltage to the nearest sixteenth of full scale. Because of the nature of the folding operation, the output bits appear in Gray Code instead of normal binary code.

Figure 6:
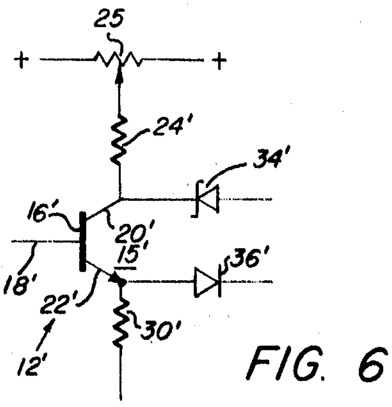
FIG. 6 is an alternative embodiment of the folding circuit shown in FIG. 2.

FIG. 6 shows an alternative embodiment of the folding circuit 12 shown in FIG. 2. The folding circuit 12' shown in FIG. 6 corresponds in almost every respect to the circuit in FIG. 2 and therefore the numbers of each of the elements correspond to that of FIG. 2 except for the prime notations on the element numbers. The folding circuit 12' of FIG. 6 differs from the folding circuit 12 shown in FIG. 2 in the following respect. In the folding circuit 12 of FIG. 2, the folding point of each folding circuit was matched to the midpoint of the output range of the previous folding circuit by properly selecting the zener diodes 34. In the embodiment of FIG. 6, the folding point of each folding circuit is matched to the midpoint of the output range of the previous circuit by adjusting the collector electrode 20' supply voltage for each folding circuit 12' by providing a connection to the slide of a potentiometer 25 in place of the fixed positive voltage source at terminal 26 of FIG. 2. The resistance of the potentiometer 25 should be much lower than the resistance of resistor 24' so that varying the adjustment does not offset the match between the resistances 24' and 30'.

Figure 7:
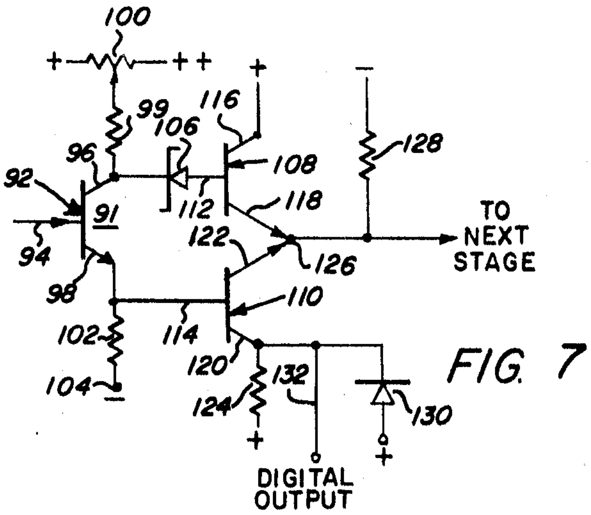
FIG. 7 is a circuit diagram of an alternative embodiment of one stage of the present invention as shown in FIG. 1.

FIG. 7 illustrates an alternative embodiment of the converter stages shown in FIG. 1. The circuit shown in FIG. 7 may be used to replace each of the folding circuit 12 and threshold circuit 14 combinations making up each of the stages in FIG. 1. FIG. 7 shows a converter stage 90 which includes a phase splitter 91. The phase splitter 91 includes a transistor 92 having base, collector and emitter electrodes 94, 96 and 98 respectively. The collector electrode 96 is connected to an adjustable potentiometer 100 via a resistor 99. The emitter electrode 98 is connected to a negative source of potential at terminal 104 via a resistor 102. The collector electrode 96 is also connected to the base electrode 112 of a transistor 108 via a zener diode 106. The emitter electrode 98 of transistor 92 is connected directly to the base 114 of a transistor 110. The transistor 108 also has collector and emitter electrodes 116 and 118 respectively. The collector electrode 116 of transistor 108 is connected to a source of positive potential. The transistor 110 also has collector and emitter electrodes 120 and 122 respectively. The emitter electrodes 118 and 122 of transistors 108 and 110 respectively are both connected directly to a terminal 126. A resistor 128 is connected at one end to the terminal 126 and at its other end to a negative source of potential. The collector electrode 120 of the transistor 110 is connected to a positive potential source via a resistor 124. Also connected to the collector electrode 120 of the transistor 110 is a diode 130, the other end of which is connected to a source of positive potential. The digital output from the converter stage 90 is obtained on a line 132 which is connected to the connection between the collector electrode 120 of transistor 110 and the diode 130 and the resistor 124.

One feature of the converter 10 shown in FIG. 5 is that the threshold circuits 14 must each be adjusted to match the corresponding folding circuit 12. The converter stage 90 shown in FIG. 7 eliminates the need for such threshold adjustment by using the same circuit elements to extract the digital output as are used to perform the folding operation, so that the digital output transitions would be forced to occur at the folding point. The converter stage 90 of FIG. 7 also includes the folding point adjustment embodied in the folding circuit 12' shown in FIG. 6. The phase splitter 91 of the converter stage 90 operates in the same fashion as described with respect to FIGS. 3, 5 and 6 and the zener diode 106 serves to offset the collector electrode 96 voltage range so that it overlaps the voltage range of the emitter electrode 98. The two output transistors 108 and 110 serve as parallel-connected emitter followers which perform the folding operation by following only the most positive of their inputs. One of the two transistors 108 and 110 will be cut off most of the time, however, so that a digital output may be obtained by allowing the collector current of one of the two transistors 108 and 110 to flow through the resistor 124. The presence or absence of a voltage drop across the resistor 124, then indicates the desired bit of digital information.

Due to the folding operation, the output of each converter stage of the present invention has only one-half the range of its input. Consequently, the amount of voltage variation decreases through successive stages of the converter, implying that each stage of the converter must be uniquely designed. If an amplification factor of two is added to each stage it becomes possible to make all of the stages identical, since the amplification compensates for the halving so that all converter stages have the same input and output range. The folding circuit 140 shown in FIG. 8 employing the operational amplifier 146 allows all of the converter stages to be identical. The transfer characteristic of the folding circuit 140 is shown in FIG. 9.

Figure 8:
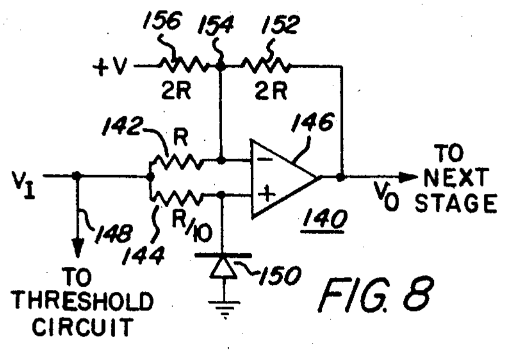
FIG. 8 is a circuit diagram showing another embodiment of a folding circuit shown in FIG. 1.
Figure 9:
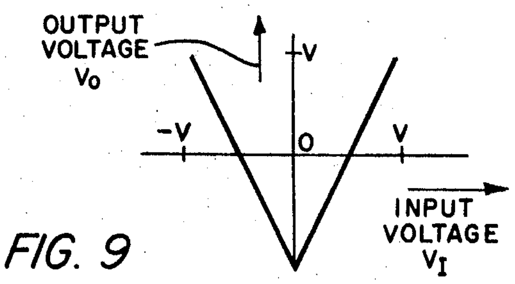
FIG. 9 is a graph of the transfer characteristic of the folding circuit shown in FIG. 8.

FIG. 8 shows another embodiment of a folding circuit which may be used in the present information. In the folding circuit 140 the input voltage is applied to a pair of parallel connected resistors 142 and 144, each of which is applied to the inverting (−) and noninverting input (+) input terminal of the amplifier 146 and at the other end is connected to ground. A feedback resistor 152 is connected between the output of amplifier 146 and a terminal 154 is connected between the output of amplifier 146 and a terminal 154 which is connected between the resistor 142 and the inverting input terminal of the amplifier 146. A bias current is applied to the terminal 154 via a resistor 156 which connects to a source of positive potential.

In the operation of the folding circuit 140 when the input voltage $V_I$ is positive, the diode 150 is cut off so that this voltage is fed directly to the noninverting input of the operational amplifier 146. The amplifier 146 acts to maintain its inverting input at the same potential, thus causing the output voltage $V_O$ to swing twice as widely as the input voltage $V_I$ due to the voltage dividing action of the resistors 152 and 156. This action gives the entire circuit 140 a gain of two. When the input voltage is negative, the diode 150 grounds the amplifier 146 noninverting input, causing the amplifier 146 to act as a gain-of-two inverter. The bias voltage applied through the resistor 156 to the terminal 154 is used to offset the output voltage $V_O$ negatively by a voltage which causes the output voltage $V_O$ to have the same range as the input voltage $V_I$, as shown in the transfer characteristic of FIG. 9.

It should be understood, of course, that the foregoing disclosure relates to only the preferred embodiments of the invention and that numerous modifications or alterations may be made therein without departing from the spirit and the scope of the invention as set forth in the appended claims.

Although the preferred embodiment of the invention have been constructed only NPN transistors, they may employ PNP transistors. In the embodiment of FIG. 5, the following elements were employed:

| Element: | Type of value |
|---|---|
| All Transistors 16 | 2N2224 |
| Zener Diodes 34 | 1N755 |
| Diodes 36 | CTP309 |
| Resistors 24 | 680 |
| Resistors 30 | 560 |
| Resistors 38 | 5.6K |
| Resistors 40 | 10K |
| Resistors 50 | 68K |
| Resistors 52 | 5K |
| Resistors 54 | 3.3K |
| Resistor 80 | 10K |

I claim:

1. An analog to digital converter for converting an analog signal to a digital signal represented in Gray code, said converter comprising:

input means for receiving an analog signal;

a plurality of stages sequentially connected to operate serially on said analog signal to which said analog signal is applied from the input means, the stages including a chain of folding circuits each having input and output terminals, each of said circuits having a foldover voltage point which is matched to the midpoint of the output range of the previous folding circuit; and a separate threshold circuit associated with each of said folding circuits, each of said threshold circuits connected to the input of the associated folding circuit, such that the signal is applied to the next threshold circuit if above the foldover point and inverted and passed to said next threshold circuit if below said foldover point so as to produce a Gray code output bit while the corresponding folding circuit passes on to the next stage an analog voltage representative of the location of the input with respect to the voltage range.

2. A converter as set forth in claim 1 wherein:

said folding circuits each include a unity gain phase splitter having a negative slope transfer characteristic, said phase splitter being connected to a pair of parallel-connected diodes, the diodes selecting the more positive output of the splitter.

3. A converter as set forth in claim 2 wherein:

said phase splitter includes a transistor having base, collector and emitter electrodes, said collector and emitter electrodes providing approximately the same resistance values, and said pair of diodes consists of a zener diode connected between said collector electrode and an output terminal of said folding circuit and the other diode connected between said emitter electrode and the output terminal, the zener diode, voltage being selected so as to match the foldover point to the midpoint of the output range of the previous folding circuit.

4. A converter as set forth in claim 2 wherein:

said phase splitter includes a transistor having base, collector and emitter electrodes, a potentiometer coupled to said collector electrode and wherein said pair of diodes consists of a zener diode connected between said connector electrode and an output terminal of said folding circuit and the other diode connected between said emitter electrode and the output terminal, said potentiometer adjustable to vary the collector electrode supply voltage so as to match the folding point of each folding circuit to the midpoint of the output range of the previous folding circuit.

5. A converter as set forth in claim 1 wherein:

each of said folding circuits includes an operational amplifier having an inverting input and a noninverting input, a diode being connected from said noninverting input to ground, whereby a positive input voltage cuts off said diode feeding the voltage directly to the noninverting amplifier input causing the amplifier to provide a gain of two output voltage whereas when a negative input voltage is applied, the diode grounds the noninverting amplifier input, causing the amplifier to act as a gain of two inverter.

6. A converter as set forth in claim 1 wherein:

each threshold circuit includes a limiting amplifier, said amplifier serving to feed the analog signal directly to the next threshold circuit and a Gray code output bit is produced if the analog signal is above the midpoint of its input range while if the analog signal is below the midpoint range of the analog signal input, the analog signal is inverted and passed on to the next threshold circuit.

7. A converter as set forth in claim 6 wherein:

said limiting amplifier of each of said threshold circuits includes a transistor having base, collector and emitter electrodes, a potentiometer being coupled to said base electrode, said transistor being adjusted to turn on and off precisely at the foldover voltage point by varying the potentiometer so as to set the necessary level of base electrode bias current.

8. An analog to digital converter for converting an analog signal to a digital signal represented in Gray code, said converter comprising:

input means for receiving an analog signal;

a plurality of stages sequentially connected to operate serially on said analog signal to which the analog signal is applied from the input means, the stages including a chain of of folding circuits each having input and output terminals, each of said circuits having a foldover voltage point which is matched to the midpoint of the output range of the previous folding circuit;

said folding circuits each including a unity gain phase splitter having a negative slope transfer characteristic, said phase splitter being connected to a pair of parallel connected diodes, the diodes selecting the more positive output of the splitter;

a separate threshold circuit associated with each of said folding circuits, each of said threshold circuits connected to the input of the associated folding circuit such that the signal is applied to the next threshold circuit if above the foldover point and inverted and passed to said next threshold circuit if below said foldover point so as to produce a Gray code output bit while the corresponding folding circuit passes on to the next stage an analog voltage representative of the location of the input with respect to the voltage range; and each threshold circuit including a limiting amplifier, said amplifier serving to feed the analog signal directly to the next threshold circuit to produce the Gray code output.

9. An analog to digital converter for converting an analog signal to a digital signal represented in Gray code, said converter comprising:

input means for receiving an analog signal;

a plurality of stages sequentially connected to operate serially on said analog signal to which the analog signal is applied from the input means, the stages including a chain of folding circuits each having input and output terminals, each of the said circuits having a foldover voltage point which is matched to the midpoint of the output range of the previous folding circuit;

said folding circuits each including a unity gain phase splitter having a negative slope transfer characteristic, said phase splitter being connected to a pair of parallel connected diodes, the diodes selecting the more positive output of the splitter;

said phase splitter including a transistor having base, collector and emitter electrodes, said collector and emitter electrodes providing approximately the same resistance values, and said pair of diodes consisting of a zener diode connected between said collector electrode and an output terminal of said folding circuit and the other diode connected between said emitter electrode and the output terminal, the zener diode voltage being selected so as to match the foldover point to the midpoint of the output range of the previous folding circuit;

a separate threshold circuit associated with each of said folding circuits, each of said threshold circuits sequentially connected to the input of the associated folding circuit such that the signal is applied to the next threshold circuit if above the foldover point and inverted and passed to said next threshold circuit if below said foldover point so as to produce a Gray code output bit while the corresponding folding circuit passes on to the next stage an analog voltage representative of the location of the input with respect to the voltage range;

each threshold circuit including a limiting amplifier, said amplifier serving to feed the analog signal directly to the next threshold circuit; and said limiting amplifier of each of said threshold circuits including a transistor having base collector and emitter electrodes, a potentiometer being coupled to said base electrode, said transistor being adjusted to turn on and off precisely at the foldover voltage point by varying the potentiometer so as to set the necessary level of base electrode bias current.

10. An analog to digital converter for converting an analog signal to a digital signal represented in Gray code, said converter comprising:

input means for receiving an analog signal;

a plurality of stages sequentially connected to operate serially on said analog signal to which the analog signal is applied from the input means, the stages including a chain of folding circuits each having input and output terminals, each of said circuits having a foldover voltage point which is matched to the midpoint of the output range of the previous folding circuit;

said folding circuits each including a unity gain phase splitter having a negative slope transfer characteristic, said phase splitter being connected to a diode, the diode electing the more positive output of the splitter;

said phase splitter including a transistor having base, collector and emitter electrodes, a potentiometer coupled to said collector electrode, said potentiometer adjustable to vary the collector electrode supply voltage so as to match the folding point of each folding circuit to the midpoint of the output range of the previous folding circuit;

a separate threshold circuit associated with each of said folding circuits, each of said threshold circuits connected to the input of the associated folding circuit such that the signal is applied to the next threshold circuit if above the foldover point and inverted and passed to said next threshold circuit if below said foldover point, each of said threshold circuits serving to determine whether its input is above or below the foldover point of the corresponding folding circuit so as to produce a Gray code output bit while the corresponding folding circuit passes on to the next stage an analog voltage representative of the location of the input with respect to the voltage range; and each threshold circuit including a pair of parallel emitter followers connected to the output of the preceding folding circuit, said emitter followers performing the folding operation by following only the most positive of their inputs, one of the two emitter followers being cut off most of the time.